United States Patent [19]
Vu et al.

[11] Patent Number: 5,807,771
[45] Date of Patent: Sep. 15, 1998

[54] RADIATION-HARD, LOW POWER, SUB-MICRON CMOS ON A SOI SUBSTRATE

[75] Inventors: Truc Q. Vu, Signal Hill; Chen-Chi P. Chang, Newport Beach; James S. Cable, San Clemente; Mei F. Li, Mission Viejo, all of Calif.

[73] Assignee: Raytheon Company, Lexington, Mass.

[21] Appl. No.: 658,188

[22] Filed: Jun. 4, 1996

[51] Int. Cl.⁶ ........................................... H01L 21/84
[52] U.S. Cl. ..................... 438/154; 438/164; 438/165; 438/163; 438/526; 438/953
[58] Field of Search ................... 438/149, 152, 438/153, 154, 163, 164, 165, 166, 526, 527, 529, 953, 155, 184, 201

[56] References Cited

U.S. PATENT DOCUMENTS

| | | | |
|---|---|---|---|
| 4,247,862 | 1/1981 | Klein | 438/953 |
| 4,459,739 | 7/1984 | Shepherd et al. | 438/164 |
| 4,463,492 | 8/1984 | Maeguchi | 438/166 |
| 4,506,436 | 3/1985 | Bakeman et al. | 438/526 |
| 4,575,746 | 3/1986 | Dingwall . | |
| 4,775,641 | 10/1988 | Duffy et al. | 438/166 |
| 5,137,837 | 8/1992 | Chang et al. | 437/21 |
| 5,162,254 | 11/1992 | Usui et al. | 438/165 |
| 5,612,230 | 3/1997 | Yuzurihara et al. | 438/164 |

FOREIGN PATENT DOCUMENTS

| 3-166839 | 7/1993 | Japan | 438/184 |
|---|---|---|---|

OTHER PUBLICATIONS

S. Wolf, "Silicon Processing for the VLSI Era" vol. II, pp. 144–146, 354–359, Jun. 1990.

*Primary Examiner*—Charles L. Bowers, Jr.
*Assistant Examiner*—Leon Radomsky
*Attorney, Agent, or Firm*—Leonard A. Alkov; Glenn H. Lenzen, Jr.

[57] ABSTRACT

A radiation-hard, low-power semiconductor device of the complementary metal-oxide semiconductor (CMOS) type which is fabricated with a sub-micron feature size on a silicon-on-insulator (SOI) substrate (12). The SOI substrate may be of several different types. The sub-micron CMOS SOI device has both a fabrication and structural complexity favorably comparable to conventional CMOS devices which are not radiation-hard. A method for fabricating the device is disclosed.

21 Claims, 2 Drawing Sheets

RADIATION-HARD, LOW POWER, SUB-MICRON CMOS ON A SOI SUBSTRATE

BACKGROUND OF THE INVENTION

1. Field of the Invention

The present invention relates to the fabrication of low-power semiconductor devices of the complementary metal-oxide semiconductor (CMOS) type which are fabricated with a sub-micron feature size on a silicon-on-insulator (SOI) substrate. The SOI substrate may be of the SIMOX type (separation by implantation of oxygen), bonded and etched-back type, or other types of SOI wafers. More particularly, the present invention relates to such sub-micron CMOS SOI devices which have low power consumption, are radiation-hard, and have both a fabrication and structural complexity favorably comparable to conventional devices which are not radiation-hard.

2. Related Technology

Complementary metal-oxide semiconductor (CMOS) technology is so-named because it uses both p-type and n-type metal-oxide semiconductor transistors in its circuits. CMOS is widely used in circuits in which low power consumption is important. CMOS is also used in circuits where very high noise margins are important (e.g., in radiation-hard circuits).

With the development of very large-scale integration (VLSI) circuits, power consumption in conventional complementary metal-oxide semiconductor (CMOS) circuits began to exceed acceptable limits. A lower-power technology was needed to exploit the VLSI fabrication techniques. CMOS on SOI represented such a technology. In CMOS technologies, both n-channel and p-channel transistors must be fabricated on the same wafer. From 1968 to 1987, a 200-fold increase in functional density and a 20-fold increase in speed of CMOS VLSI integrated circuits took place. One example of this tremendous increase in density is the Intel 4004 4-bit microprocessor which in 1971 had 2,300 devices. By 1985, the well-known Intel 80386 16-bit processor had 275,000 devices.

Some operating environments for semiconductor devices, such as CMOS devices, require that the transistors of these devices be resistant to radiation. Exposure to radiation can cause conventional devices which are not radiation-hard to malfunction or destruct. It is recognized that resistance to radiation effects and destruction can be improved by fabricating devices on SOI substrates if the edge and back-channel leakage currents can be reduced. The small volume of silicon in the SOI layer improves the resistance to radiation-induced single-event upset, while latch-up paths between adjacent devices (i.e., transistors) which are present in conventional bulk-semiconductor devices, are eliminated in the SOI devices.

A conventional radiation-hard, high-voltage semiconductor device of SOI CMOS type is known according to U.S. Pat. No. 5,237,837, issued 11 Aug. 1992, to Chen-Chi P. Chang, and Mei F. Li, who are also coinventors of the present invention. According to the '837 patent, the radiation-hard semiconductor device includes highly-doped buried n-type and p-type wells in a first silicon layer over an insulator, and over which a second silicon layer is formed with congruent lightly-doped n-type and p-type layers in which complementary MOSFET active devices are formed. The heavy wells provide some resistance to back-channel radiation-induced leakage, it is believed. A trench is formed between the active areas of the wells, and these active areas are isolated from one another by a radiation-hard insulator, preferably silicon dioxide or boron silicon dioxide glass, placed in the trench while forming the field oxide layer. The radiation-hard field oxide in the trench provides low edge channel leakage when the devices are exposed to radiation.

With the device taught by the '837 patent, two separate silicon formation steps are required. One silicon formation step forms the highly-doped buried wells to suppress the back-channel leakage when devices are exposed to radiation, and the other forms the lightly-doped overlying and active portion of the wells. Additionally, several mask and etch steps are required, the feature sizes of the device are not in the sub-micron range, and the operating voltage is high. Planarization of the surface produced in this device after application of the boron silicon dioxide glass into the separation trench is achieved by use of plasma etch-back techniques. Reduction of the scale of the device would be difficult because the process requires a thick silicon layer, and many masking and etching steps with concomitant alignment challenges.

SUMMARY OF THE INVENTION

CMOS processes have been considered to produce devices having low power consumption. However, at deep-sub-micron feature sizes (i.e., less than 0.25 micron) several tens of millions of transistors will be integrated in a single substrate chip. This level of device concentration and proximity requires that the CMOS devices dissipate much less power than is presently achievable. Low power dissipation requires that both the supply voltage and the threshold voltage for the devices be lowered. But, at the same time, the circuit performance must stay at a level favorably comparable to the present devices, or at better levels. Further, at deep sub-micron feature sizes, the standard lateral isolation techniques using localized oxidation (i.e., LOCOS) are no longer feasible because of the lateral encroachment of the "bird's beak." The use of trench isolation on SOI can be used to eliminate the encroachment problem, to feature sizes as small as 0.1 micron, it is believed. CMOS on SOI is considered as a viable solution to this challenge.

When CMOS devices operate in a radiation-active environment, the edge along the side wall of the gate island and at the implant backside can be turned "on" (i.e., become conductive) and cause current leakage. This is the result of the presence of fixed positive charges in the field or buried oxide layer (underneath the implant wells), which are created by the penetrating radiation. It is believed that a heavy well doping at the bottom of the implant wells will suppress the back-side leakage. Also, a radiation-hard field oxide in the isolation trench will provide negative charges which neutralize the field oxide.

In view of the above, and the known deficiencies of the related technology, including that outlined above, it is an object for the present invention to avoid one or more of these deficiencies.

Another object for this invention is to provide a SOI radiation-hard, low-power CMOS device in which successive ion implantations are used in a single silicon layer to produce shallow and deep implantation areas in the wells.

An object for this invention is to provide a SOI radiation-hard, low-power CMOS device in which the SOI layer thickness can be in the 0.2 micron range, thus allowing the use of conventional ion implanters to implant the wells, and providing a low-power device through the use of low threshold and supply voltages.

Yet another object for this invention is to provide a SOI radiation-hard, low-power CMOS device in which chemical/ mechanical polishing (CMP) is used to planarize the laterally-isolating radiation-hard insulator.

According to one aspect, the present invention provides a process for fabricating radiation-hard, low-power, sub-micron CMOS SOI devices, the process including steps of: providing an SOI processing wafer having a bulk silicon body, and a layer of insulative material over the bulk silicon body; forming a layer of silicon over the layer of insulative material, the layer of silicon having a pair of transistor locations; forming a void space extending to the layer of insulative material between the pair of transistor locations; interposing radiation-hard insulating material in the void space; ion implanting the layer of silicon at the pair of transistor locations with respective p-type and n-type impurity atoms at selected energies to form a respective p-type well having both p-type and p$^-$-type silicon at one transistor location of the pair of transistor locations, and an n-type well having both n-type and n$^-$-type silicon at the other transistor location of the pair of transistor locations; and forming a CMOS active device in each of the wells.

According to another aspect, the present invention provides a radiation-hard, low-power, sub-micron CMOS SOI device including a bulk silicon body; a layer of insulative material over the bulk silicon body; a layer of silicon over the layer of insulative material; and a p-type well formed in the layer of silicon, the p-type well having both p-type and p$^-$-type silicon integral with one another, and an n-type well formed in the layer of silicon and spaced from the p-type well, the n-type well having both n-type and n$^-$-type silicon integral with one another; and a CMOS active device formed in each of the wells.

One of the advantages of the radiation-hard, low-power, sub-micron CMOS SOI process of the present invention is that the channel length of the device can be reduced to significantly 0.1 $\mu$m through the use of shallow trench isolation and a thin SOI silicon layer.

Other aspects, features, and advantages of the present invention will become apparent to those ordinarily skilled in the pertinent arts from a reading of the following detailed description of a singular exemplary preferred embodiment with reference to the accompanying drawings, in which the same reference numerals are used to indicate the same features, or features which are analogous in structure or function, throughout the several drawing Figures.

BRIEF DESCRIPTION OF THE DRAWING FIGURES

FIGS. 1 to 9 are simplified cross sectional views illustrating steps in a method of fabricating a radiation-hard semiconductor device embodying the present invention, as well as the structure of a functional device resulting from practice of this method.

DETAILED DESCRIPTION OF A PREFERRED EXEMPLARY EMBODIMENT OF THE INVENTION

Rather than provide an exhaustive description of all possible alternative embodiments of the present invention, a detailed description of one exemplary preferred embodiment which exemplifies the principles of the present invention will be provided. However, those ordinarily skilled in the pertinent arts will realize that other alternative embodiments in accordance with the principles of the present invention can be implemented. Accordingly, it is intended that these alternative embodiments be considered as also within the scope of the principles of the present invention.

Figure 1:
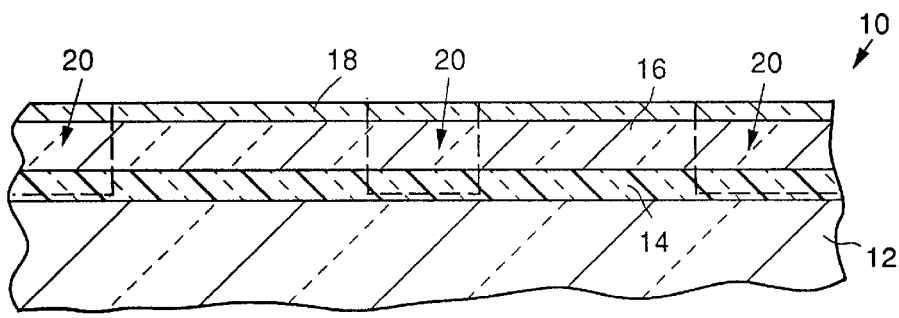

With reference to drawing FIGS. 1–9, and particularly to FIG. 1, the starting material in a SOI CMOS process of the present invention is an SOI semiconductor processing wafer 10. The SOI wafer may be provided by use of any one of several presently-available processes, as well as by equivalent and substitute process as may hereafter become available. For example, wafer 10 may be of the SIMOX type, or a bonded and etched-back type of wafer. Considering the structure of the wafer 10, it is seen that this wafer includes a bulk 12 of silicon, upon which an insulating layer 14 of silicon dioxide has been formed. Atop of the layer 14 of silicon dioxide, a silicon layer 16 is formed. This silicon of layer 16 may be formed by wafer bonding and etch back, for example. Next, a protective layer 18 of silicon oxide or silicon nitride is formed on top of silicon layer 16. The resulting structure is masked with photoresist, exposed for partial removal of the photoresist, and etched to remove material at particular locations (indicated by the arrows 20) down to the silicon dioxide layer 14. Thus, hereafter, the reference numerals 20 may be considered to refer to voids or trenches formed by the etching operation. The numeral 10 is also hereafter used to refer to wafer 10 even as its structure is modified and added to by various processing steps.

Figure 2:
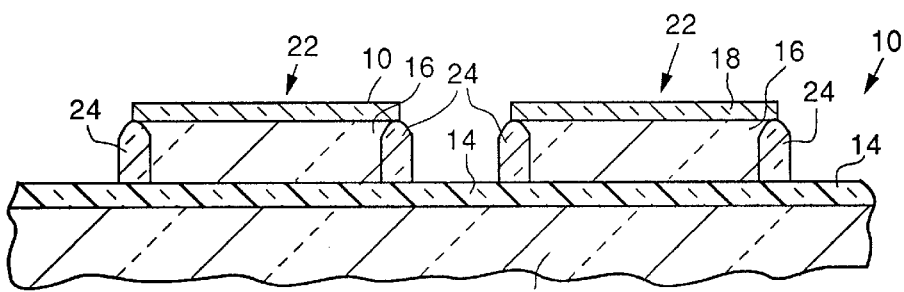

As is seen in FIG. 2, the removal of the material indicated with arrows 20 forms voids or trenches in the layers 16 and 18, and leaves "wells" 22 of silicon layer 16 standing atop of silicon dioxide insulator layer 14, presently these silicon wells are somewhat in the form of islands rather than wells. However, this structure will be changed to one more familiar to the use of the term "well", as will be seen. At each side of the wells 22, a layer 24 of insulative silicon oxide is formed.

Figure 3:
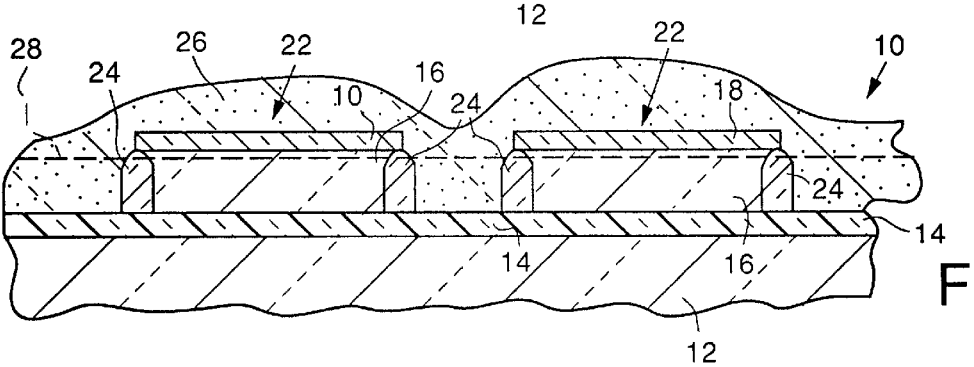

FIG. 3 illustrates that over the structure described immediately above is formed a layer 26 of doped glass. Preferably, layer 26 is formed by chemical vapor deposition. Preferred glasses for the layer 26 are: boron silicon dioxide glass, phosphorous silicon dioxide glass, boron phosphorous silicon dioxide glass, plasma enhanced tetraethyl orthosilicate, boron doped tetraethyl orthosilicate, or boron and phosphorous doped tetraethyl orthosilicate. Next, chemical/mechanical polishing is used to planarize the structure to a level indicated by dashed line 28 in FIG. 3.

Figure 4:
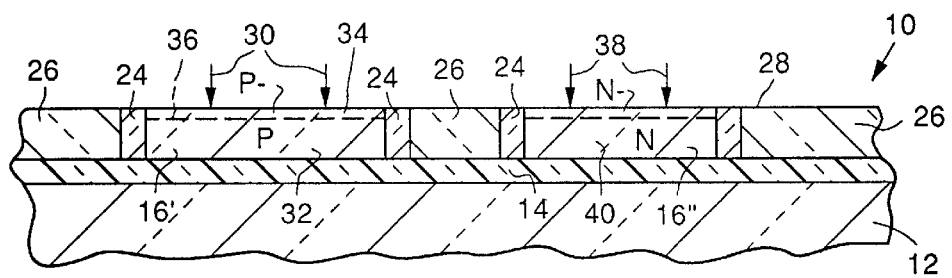

In FIG. 4 it is seen that the line 28 of FIG. 3 defines an exposed surface (also indicated with numeral 28 in FIG. 4) at which the wells 16 of silicon are exposed and separated from one another by layers 24 of insulative oxide, as well as by glass material originating with layer 26 (this material also being indicated with numeral 26 on FIG. 4). By appropriate masking, exposures for partial removal of the photoresist layers, and ion bombardments, one of the wells 16 is implanted with ions (indicated with arrows 30 bombarding onto surface 28) to form silicon of p-type. Preferably, these bombarding ions are formed of boron or indium atoms.

The p-type well (indicated with numeral 16' on FIG. 4) is implanted with ions of selectively differing energies so that the p-type impurity atoms are driven to differing depths into the silicon of well 16'. As a result, a sub-layer 32 of heavily doped p-type silicon is formed adjacent to the insulative layer 14, while a sub-layer 34 of lightly doped p-type silicon is formed adjacent to surface 28. In FIG. 4 and hereafter, the sub-layers 32 and 34 also carry the characters p and p$^-$ as an assistance to the reader in recalling the relative doping strength. Also, the sub-layers 32 and 34 are illustrated as being separated from on another by a line of demarkation formed therebetween, as illustrated by dashed line 36. Again this dashed line 36 is a convenience for the reader, and those ordinarily skilled in the pertinent arts will recognize that there is in physical reality no sharp line of demarkation between the sub-layers 32 and 34. The sub-layers 32 and 34 are formed of the same silicon layer 16 by differing levels of p-type doping.

Similarly, at the silicon well indicated with numeral 16", n-type ions (indicated on FIG. 4 by arrows 38) are bombarded onto the surface 28 at selected differing energies in order to form n-type silicon. Preferably, the n-type ions are formed from atoms of phosphorous or arsenic. The n-type well 16" is implanted with doping ions of differing energies so that the n-type impurity atoms are driven to differing depths into the silicon of well 16". A sub-layer 40 of heavily doped n-type silicon is formed adjacent to the insulative layer 14, while a sub-layer 42 of lightly doped n-type silicon is formed adjacent to surface 28. In FIG. 4 sub-layers 40 and 42 carry the characters n and $n^-$ as a reminder to the reader of the type of silicon in each sub-layer. Again, the sub-layers 40 and 42 are illustrated as being separated from on another by a line of demarkation, illustrated by dashed line 44. The dashed line 44 is also merely a convenience for the reader, and no such physical demarkation exists.

Figure 5:
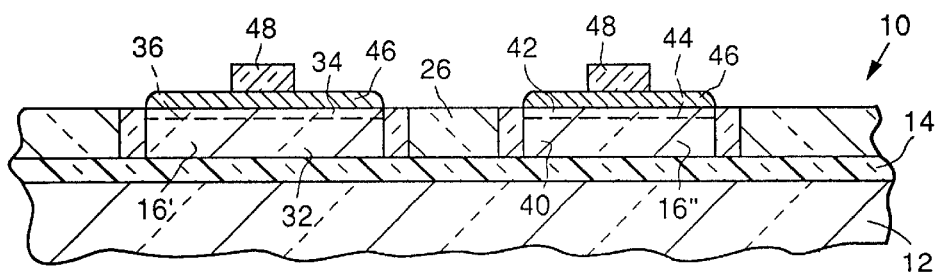
Figure 6:
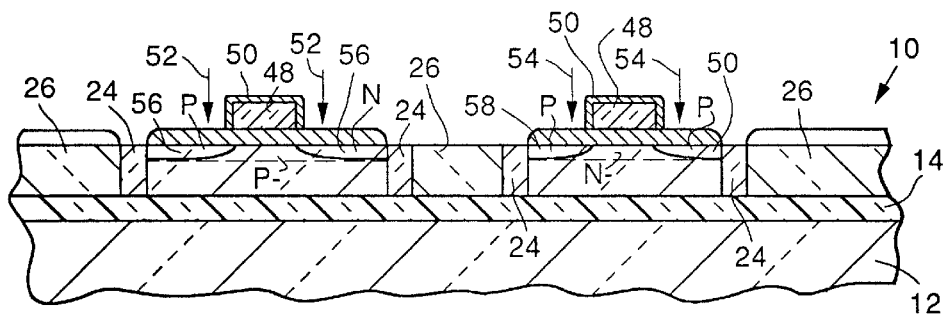

Turning attention now to FIG. 5, it is seen that a respective layer 46 of silicon oxide is formed over each of the silicon wells 16' and 16". Next, the structure 10 is masked, patterned, and polysilicon is applied and etched to form respective gate precursor structures 48 at each of the wells 16. These polysilicon gate precursor structures 48 are partially oxidized to provide a protective layer 50 of silicon oxide, as is seen in FIG. 6. FIG. 6 also illustrates that by appropriate additional masking and respective n-type and p-type ion bombardments (indicated by respective arrows 52 and 54), respective n-type source and drain precursor implants (indicated with numeral 56) are formed in p-type well 16', while p-type source and drain precursor implants (indicated with numeral 58) are formed in n-type well 16". Preferably, the n-type ions are formed from atoms of arsenic or phosphorous, while the p-type ions are formed of atoms of boron.

Figure 7:
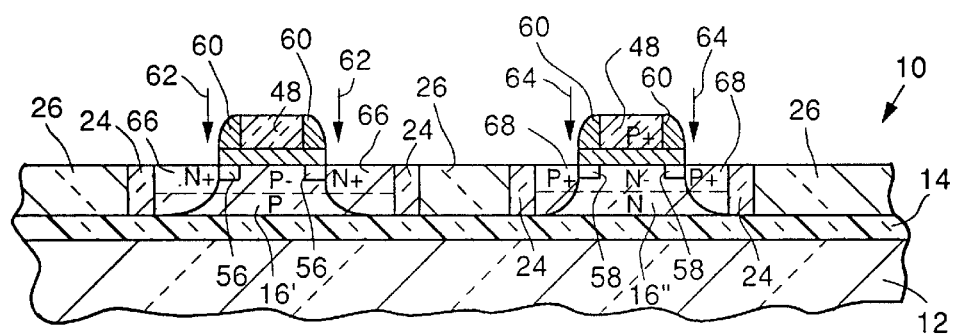

Continuing to FIG. 7, it is next seen that gate spacers 60 are formed at each gate precursor structure 48 by chemical vapor deposition of silicon oxide or silicon nitride, and are etched back to the configuration schematically depicted. Additional masking, patterning and additional n-type and p-type ion bombardments (indicated by respective arrows 62 and 64) are used to form more highly doped $n^+$-type and $p^+$-type source and drain implants of n-type in well 16' and of p-type in well 16" (indicated respectively with reference numerals 66 and 68). Because the implants 66 and 68 are more highly doped than implants 56 and 58, while the implants 66 are blocked in part by the gate spacers 60, the remaining areas of implants 56 and 58 may be considered to be of n-type and p-type in comparison. The implants 66 and 68 penetrate to the insulative layer 14. Preferably, the p-type impurity atoms are implanted into the layer of silicon at an energy level sufficient to form a zone of p-type silicon adjacent to the insulative layer 14 which has a doping level of about $10^{18}$ atom/cm$^3$. Also, preferably the n-type impurity atoms are implanted into the layer of silicon at an energy level sufficient to form a zone of n-type silicon adjacent to the insulative layer 14 which also has a doping level of about $10^{18}$ atom/cm$^3$. The remaining areas of implants 56 and 58 form channel extensions extending toward one another. Preferably, the n-type ions are formed from atoms of arsenic or phosphorous, while the p-type ions are formed of atoms of boron or indium.

Figure 8:
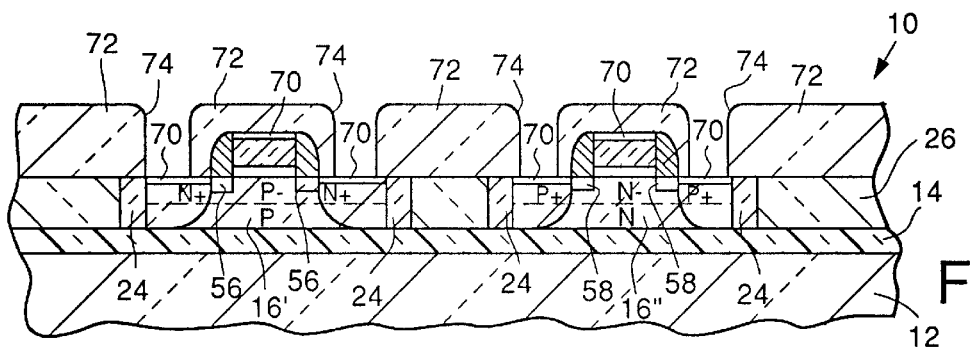

FIG. 8 shows that the oxide 46 and 50 is next removed over the exposed portion of gate polysilicon 48 and over source and drain implants 66, 68 during the gate spacer etch-back. The exposed gate polysilicon 48 and exposed silicon at source and drain implants 66 and 68 are subjected to silicide formation (i.e., by addition of titanium or tungsten, for example) to form $TiSi_2$ or $WSi_2$ layer 70. This Figure also shows addition of a layer 72 of patterned boron phosphorous silicon dioxide glass (BPSG) defining contact openings or vias 74 for connections to the source and drain implants 66 and 68 at the silicided portions 70 thereof. Other glasses may be used to form layer 72. In other words, a glass selected from the group including: boron silicon dioxide glass, phosphorous silicon dioxide glass, boron phosphorous silicon dioxide glass, plasma enhanced tetraethyl orthosilicate, boron doped tetraethyl orthosilicate, or boron and phosphorous doped tetraethyl orthosilicate may be used to form layer 72. It will be understood that the connection (or connection opening) in glass layer 72 for gate 48 is not in the plane of the Figures.

Figure 9:
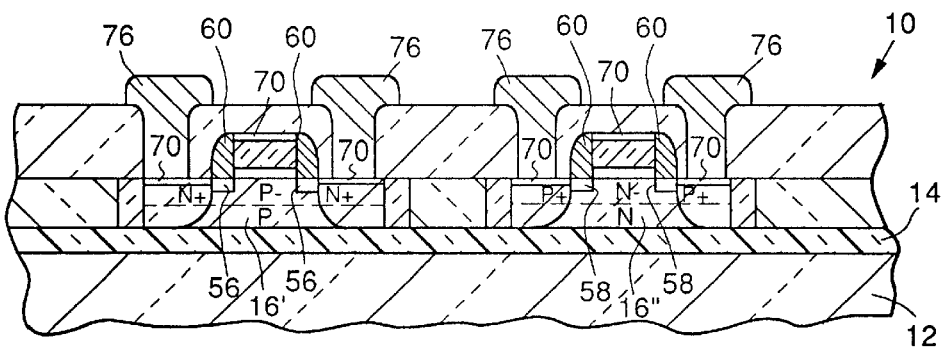

FIG. 9 shows that conductive material (i.e., a metal 1 layer) is applied, masked, and partially etched away to leave metal contacts 76 individually connecting respectively to the source and drain portions of the active devices depicted.

With the process described above, a sub-micron SOI CMOS devices which has low power consumption, is radiation-hard, and which has a fabrication complexity and a structural complexity both favorably comparable to conventional devices which are not radiation-hard can be provided. Importantly, the number of masking and epitaxial layer growth steps is reduced compared to the related technology. Only a single layer of silicon over insulation is used, which is implanted at controlled and differing energy levels to produce the p-type and $p^-$-type, as well as the n-type and $n^-$-type of silicon for the wells.

While the present invention has been depicted, described, and is defined by reference to a single particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. consequently, the invention is intended to be limited only by the spirit and scope of the appended claims, giving full cognizance to equivalents in all respects.

What is claimed is:

1. A method for fabricating a silicon-on-insulator (SOI) complementary metal oxide semiconductor (CMOS) device which has low power consumption and is radiation-hard, said method comprising steps in sequence of:
  a) providing an SOI processing wafer having a bulk silicon body, and a layer of insulative material over said bulk silicon body;
  b) forming a layer of silicon over said layer of insulative material, said layer of silicon having a pair of transistor locations;
  c) forming a void space extending to said layer of insulative material between said pair of transistor locations;
  d) interposing radiation-hard insulating material in said void space;
  e) ion implanting said layer of silicon at said pair of transistor locations with respective p-type and n-type impurity atoms at selected energies to form a respective p-type well having both p-type and $p^-$-type silicon at one transistor location of said pair of transistor locations, and an n-type well having both n-type and n⁻-type silicon at the other transistor location of said pair of transistor locations; and f) forming a CMOS active device in each of said wells.

2. The method of claim 1 wherein said step of interposing radiation-hard insulating material in said void space is accomplished by:

selecting a material from the group consisting of: boron silicon dioxide glass, phosphorous silicon dioxide glass, boron phosphorous silicon dioxide glass, plasma enhanced tetraethyl orthosilicate, boron doped tetraethyl orthosilicate, and boron and phosphorous doped tetraethyl orthosilicate; and interposing said selected material in said void space.

3. The method of claim 2 wherein said step of interposing said selected material in said void space is accomplished by coating a layer of said selected material over said layer of silicon and into said void space.

4. The method of claim 3 further including the step of planarizing said processing wafer at said coating layer of selected material to a level exposing said layer of silicon, and said selected material in said void space.

5. The method of claim 4 wherein said planarizing step is accomplished by use of chemical/mechanical polishing.

6. The method of claim 1 further including the steps of forming said void space before performing said ion implantation to provide said p-type and n-type silicon at said wells, forming another void space at a side of each well opposite to said void space therebetween, and forming an insulative side layer of silicon dioxide on each side of said silicon at said wells and bounding said void spaces.

7. The method of claim 1 further including the steps of performing said ion implantation at energy levels selected to provide respective p-type and n-type silicon in said wells adjacent to said layer of insulative material, and respective p⁻-type and n⁻-type silicon in said wells spaced away from said layer of insulative material.

8. The method of claim 1 wherein said step of forming a CMOS active device in each of said wells includes the steps of:

forming a layer of silicon oxide over said wells;

providing a polysilicon gate precursor structure over said silicon oxide layer at each of said wells;

forming a protective layer of polysilicon oxide over said polysilicon gate precursor structure; and performing a low-dose n-type ion implantation at said p-type well, and a low-dose p-type ion implantation at said n-type well to form respective source and drain extensions;

etching said polysilicon gate precursor structure, forming spacers adjacent to each side thereof and partially over said low-dose ion implantations for said source and drain extensions, and performing a high-dose n-type ion implantation at said p-type well, and a high-dose p-type ion implantation at said n-type well to form respective n⁺-type and p⁺-type silicon for said source and drain as well as for a gate-precursor structure.

9. The method of claim 8 further including the step of forming a layer of silicide over each of said gate precursor structure, and over said source and drain implants.

10. The method of claim 9 including the step of forming a conductive contact structure connecting individually with each said layer of silicide over each of said gate precursor structure and over said source and drain implants.

11. A method for fabricating a silicon-on-insulator (SOI) complementary metal oxide semiconductor (CMOS) device which has low power consumption and is radiation-hard, said method comprising steps in sequence of:

a) providing an SOI processing wafer having a bulk silicon body, and a layer of insulative material over said bulk silicon body;

b) forming a layer of silicon over said layer of insulative material, said layer of silicon having a pair of transistor locations;

c) forming a void space extending to said layer of insulative material between said pair of transistor locations;

d) forming another void space at a side of each well opposite to said void space therebetween, and forming an insulative side layer of silicon dioxide on each side of said silicon at said wells and bounding said void spaces;

e) interposing radiation-hard insulating material in said void space;

f) ion implanting said layer of silicon at said pair of transistor locations with respective p-type and n-type impurity atoms at selected energies to form a respective p-type well having both p-type and p⁻-type silicon at one transistor location of said pair of transistor locations, and an n-type well having both n-type and n⁻-type silicon at the other transistor location of said pair of transistor locations; and g) forming a CMOS active device in each of said wells.

12. The method of claim 11 wherein said step of interposing radiation-hard insulating material in said void space is accomplished by selecting a material from the group consisting of: boron silicon dioxide glass, phosphorous silicon dioxide glass, boron phosphorous silicon dioxide glass, plasma enhanced tetraethyl orthosilicate, boron doped tetraethyl orthosilicate, and boron and phosphorous doped tetraethyl orthosilicate; and interposing said selected material in said void space.

13. The method of claim 12 wherein said step of interposing said selected material in said void space is accomplished by coating a layer of said selected material over said layer of silicon and into said void space and into said another void space.

14. The method of claim 13 further including the step of planarizing said processing wafer at said coating layer of selected material to a level exposing said layer of silicon, and said selected material in said void space and in said another void space.

15. The method of claim 14 wherein said planarizing step is accomplished by use of chemical/mechanical polishing.

16. The method of claim 11 further including the steps of performing said ion implantation at energy levels selected to provide respective p-type and n-type silicon in said wells adjacent to said layer of insulative material, and respective p⁻-type and n⁻-type silicon in said wells spaced away from said layer of insulative material.

17. The method of claim 16 wherein said step of forming a CMOS active device in each of said wells includes the steps of:

forming a layer of silicon oxide over said wells;

providing a polysilicon gate precursor structure over said silicon oxide layer at each of said wells;

forming a protective layer of polysilicon oxide over said polysilicon gate precursor structure; and performing a low-dose n-type ion implantation at said p-type well, and a low-dose p-type ion implantation at said n-type well to form respective source and drain extensions;

etching said polysilicon gate precursor structure, forming spacers adjacent to each side thereof and partially over said low-dose ion implantations for said source and drain extensions, and performing a high-dose n-type ion implantation at said p-type well, and a high-dose p-type ion implantation at said n-type well to form respective $n^+$-type and $p^+$-type silicon for said source and drain as well as for a gate-precursor structure.

18. The method of claim 17 further including the step of forming a layer of silicide over each of said gate precursor structure, and over said source and drain implants.

19. The method of claim 18 including the step of forming a conductive contact structure connecting individually with each said layer of silicide over each of said gate precursor structure and over said source and drain implants.

20. A method for fabricating a silicon-on-insulator (SOI) complementary metal oxide semiconductor (CMOS) device which has low power consumption and is radiation-hard, said method comprising steps in sequence of:

a) providing an SOI processing wafer having a bulk silicon body, and a layer of insulative material over said bulk silicon body;

b) forming a single layer of silicon over said layer of insulative material, said single layer of silicon having an upper surface and a pair of well locations each providing a respective one of a pair of transistor locations;

c) forming a void space extending from said upper surface to said layer of insulative material between said pair of transistor locations;

d) forming another void space at a side of each well opposite to said void space therebetween and also extending from said upper surface to said layer of insulating material, and forming an insulative side layer of silicon dioxide on each side of said silicon at said wells and bounding said void spaces;

e) interposing radiation-hard insulating material in said void space;

f) wherein said step of interposing said selected material in said void space is accomplished by coating a layer of said selected material over said upper surface of said layer of silicon and into said void space and into said another void space;

g) further including the step of planarizing said processing wafer at said coating layer of selected material to a level exposing said layer of silicon, and said selected material in said void space and in said another void space, and planarizing said processing wafer by use of chemical/mechanical polishing;

h) ion implanting said layer of silicon exposed by said planarizing step and at said pair of transistor locations with respective p-type and n-type impurity atoms at selected energies to form a respective p-type well having both p-type and $p^-$-type silicon at one transistor location of said pair of transistor locations, and an n-type well having both n-type and $n^-$-type silicon at the other transistor location of said pair of transistor locations; and i) forming a CMOS active device in each of said wells at the transistor locations.

21. The method of claim 20 wherein said step of interposing radiation-hard insulating material in said void space is accomplished by selecting a material from the group consisting of: boron silicon dioxide glass, phosphorous silicon dioxide glass, boron phosphorous silicon dioxide glass, plasma enhanced tetraethyl orthosilicate, boron doped tetraethyl orthosilicate, and boron and phosphorous doped tetraethyl orthosilicate; and interposing said selected material in said void space.

* * * * *